United States Patent [19]

Harada et al.

[11] Patent Number: 4,812,440
[45] Date of Patent: Mar. 14, 1989

[54] RECORDING MATERIAL CONTAINING LEUCO DYE

[75] Inventors: Toru Harada, Kanagawa; Ken Iwakura, Shizuoka, both of Japan

[73] Assignee: Fuji Photo Film Co., Ltd., Kanagawa, Japan

[21] Appl. No.: 114,972

[22] Filed: Oct. 30, 1987

[30] Foreign Application Priority Data

Oct. 30, 1986 [JP] Japan .................. 61-259966

[51] Int. Cl.$^4$ .................. B41M 5/16; B41M 5/18; B41M 5/22
[52] U.S. Cl. .................. 503/223; 427/151; 428/913; 428/914; 503/215; 503/218
[58] Field of Search .................. 427/151, 150, 152; 503/218, 220, 223, 209, 213, 215; 428/913, 914

[56] References Cited

FOREIGN PATENT DOCUMENTS

| | | | |
|---|---|---|---|
| 0091402 | 6/1979 | European Pat. Off. | ............ 503/218 |
| 0030543 | 3/1975 | Japan | .................. 503/220 |
| 0012019 | 1/1977 | Japan | .................. 503/220 |
| 0101399 | 9/1978 | Japan | .................. 503/220 |

*Primary Examiner*—Bruce H. Hess
*Attorney, Agent, or Firm*—Sughrue, Mion, Zinn, Macpeak & Seas

[57] ABSTRACT

A recording material comprises a layer containing a leuco dye provided on a support, characterized in that the leuco dye has the following formula (I):

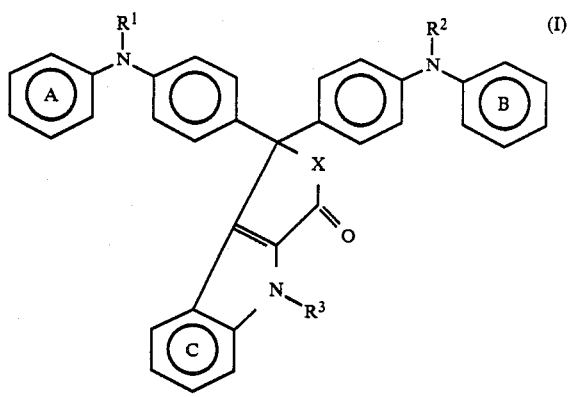

in which each of $R^1$ and $R^2$ independently is an alkyl group, an aralkyl group or an aryl group; $R^3$ is an alkyl group or an aralkyl group; X is

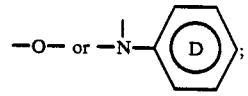

and each of $R^1$, $R^2$, $R^3$, X and the benzene rings A, B, C and D may have one or more substituent groups.

8 Claims, No Drawings

RECORDING MATERIAL CONTAINING LEUCO DYE

BACKGROUND OF THE INVENTION

1. Field of the Invention

This invention relates to a recording material such as a pressure-sensitive material, a heat-sensitive material and a light-sensitive material, and more particularly to a recording material containing a leuco dye.

2. Description of the Prior Art

In various recording materials including pressure-sensitive, heat-sensitive and light-sensitive materials, a leuco dye is frequently used as a color image forming substance. The leuco dye, which is also referred to as a redox dye, develops a color on contact with an acid color developer.

The leuco dye is generally contained in microcapsules which are dispersed in a recording material. In an image forming process, the microcapsules are broken by external energy such as pressure and/or heat so that the dye comes into contact with acid color developer which has been arranged outside of the microcapsules in the recording material.

A conventional leuco dye which develops a bluish color is a phthalide compound such as 3,3-bis(p-dimethylaminophenyl)-6-dimethyl-aminophthalide (Crystal Violet Lactone), which develops deep bluish purple color. Crystal Violet Lactone can rapidly develop the color. However, Crystal Violet Lactone does not satisfy the requirement with respect to light fastness, that is, the developed color tends to fade from the image when it is irradiated with light. Other examples of the leuco dye which develops a bluish color are described in Japanese Patent Publication No. 56(1981)-11594 (corresponding to U.S. Pat. Nos. 3,930,671) and Japanese Patent Provisional Publication Nos. 51(1976)-121035 (corresponding to U.S. patent application Ser. No. 566,851) and 51(1976)-121036 (corresponding to U.S. patent application Ser. No. 566,854).

SUMMARY OF THE INVENTION

An object of the present invention is to provide a recording material which gives a blue color image improved in the color density and the light fastness.

There is provided by the present invention a recording material comprising a layer containing a leuco dye provided on a support, wherein the leuco dye is a novel leuco dye having the following formula (I):

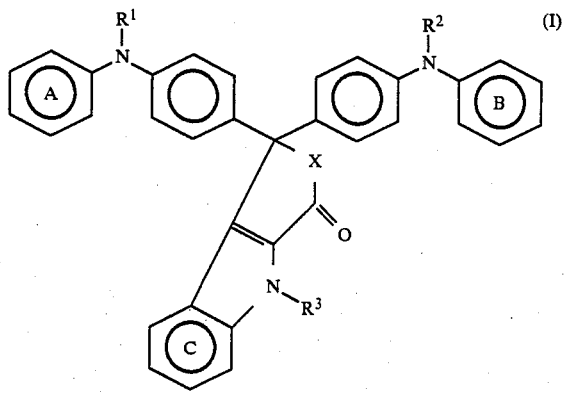

In the formula (I), each of $R^1$ and $R^2$ independently is a monovalent group selected from the group consisting of an alkyl group, an aralkyl group and an aryl group. "X" is

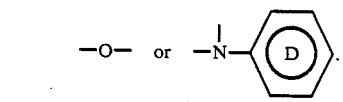

Each of $R^1$, $R^2$, $R^3$, X and the benzene rings A, B, C and D may have one or more substituent groups.

The alkyl group represented by $R^1$, $R^2$ and $R^3$ preferably has 1 to 22 carbon atoms. The alkyl group may be of a straight chain or a branched chain and may have one or more substituent groups such as a halogen atom, cyano, an alkoxy group or hydroxyl.

Examples of the aralkyl group represented by $R^1$, $R^2$ and $R^3$ include benzyl and phenethyl. The aryl moiety of the aralkyl group may have one or more substituent groups such as chlorine, a lower alkyl group (having 1 in which each of $R^1$ and $R^2$ independently is a monovalent group selected from the group consisting of an alkyl group, an aralkyl group and an aryl group; X is

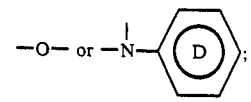

and each of $R^1$, $R^2$, $R^3$, X and the benzene rings A, B, C and D may have one or more substituent groups.

The present inventors have found that the novel leuco dye having the formula (I) is improved in not only the color developing rate but also the density and the light fastness of the developed color. Therefore, the leuco dye can be advantageously used as a color image forming substance (blue color image forming substance) for a recording material.

The developed blue color of the leuco dye is especially suitable for a monochromatic recording material. Therefore, the recording material of the invention is preferably used as a pressure-sensitive material or a heat-sensitive material.

DETAILED DESCRIPTION OF THE INVENTION

The leuco dye employed in the present invention has the following formula (I):

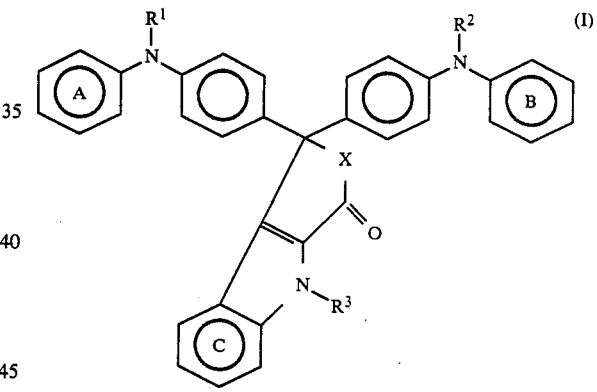

In the formula (I), each of $R^1$ and $R^2$ independently is a monovalent group selected from the group consisting of an alkyl group, an aralkyl group and an aryl group. "X" is

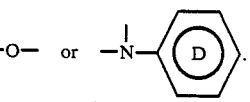

to 4 carbon atoms), a lower alkoxy group (having 1 to 4 carbon atoms) and nitro.

An example of the aryl group represented by $R^1$ and $R^2$ is phenyl. The aryl group may have one or more substituent groups such as a lower alkyl group (having 1 to 4 carbon atoms), a lower alkoxy group (having 1 to 4 carbon atoms) and chlorine.

Each of $R^1$, $R^2$, X and the benzene rings A, B, C and D may have one or more substituent groups such as a halogen atom (preferably chlorine or bromine), cyano, nitro, a lower alkyl group (having 1 to 4 carbon atoms), a lower alkoxy group (having 1 to 4 carbon atoms), amino, an alkylamino group (the alkyl moiety having 1 to 12 carbon atoms), a dialkylamino group (the alkyl moiety having 1 to 8 carbon atoms) and an acylamino group (having 1 to 8 carbon atoms).

In the formula (I), it is most preferred that each of $R^1$ and $R^2$ independently is an aryl group.

Examples of the leuco dyes which are preferably used in the invention are described hereinafter.

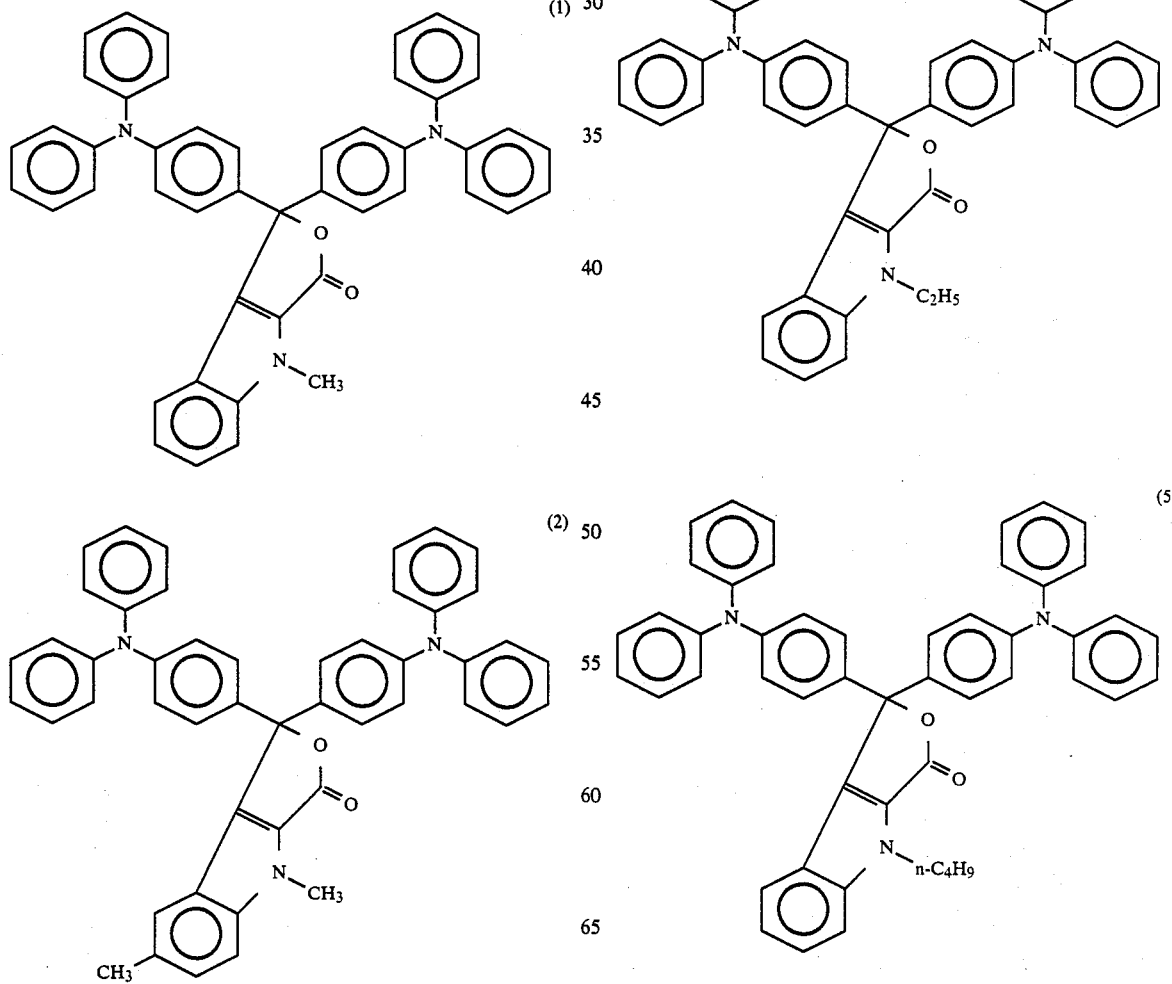

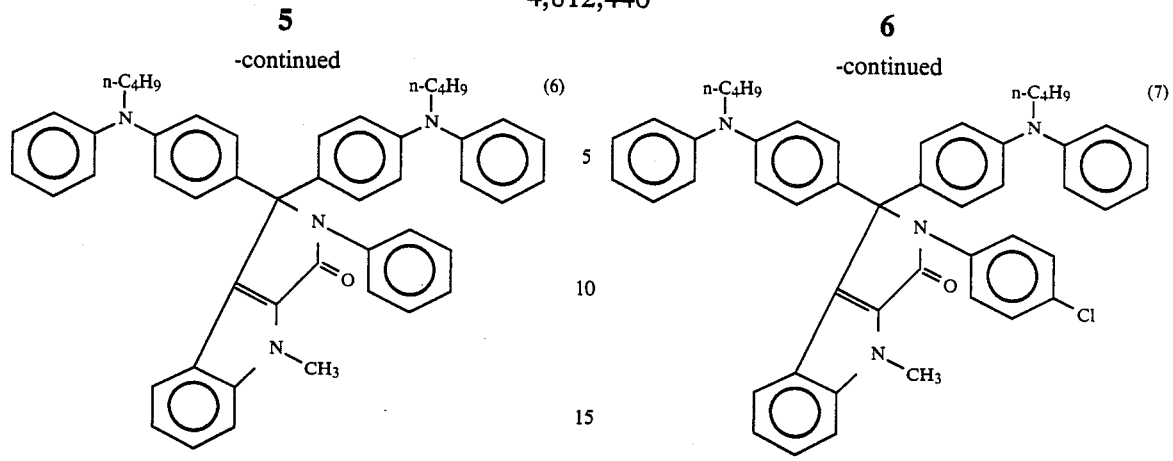
The leuco dyes used in the present invention can be easily synthesized by the following procedure.
SYNTHESIS EXAMPLE 1
Synthesis of Leuco Dye (1)
The leuco dye (1) was synthesized from 4-N,N-diphenylaminobenzaldehyde by way of the compounds of following formulas (i) to (v):
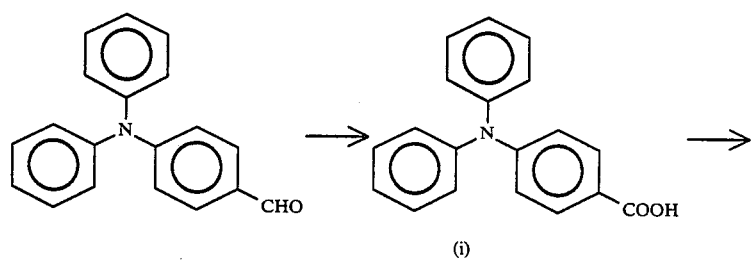
(i)
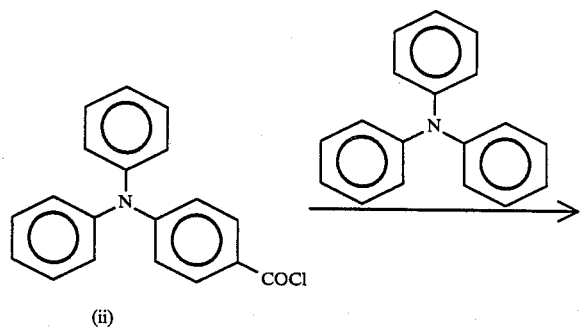
(ii)
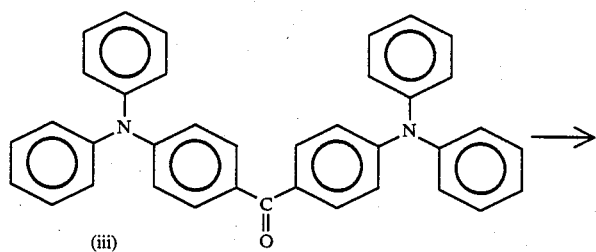
(iii)

-continued

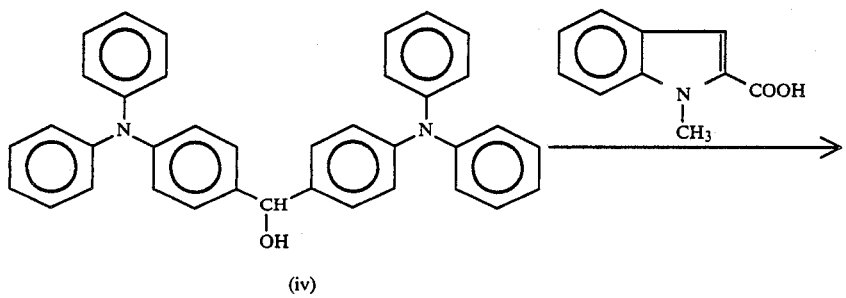

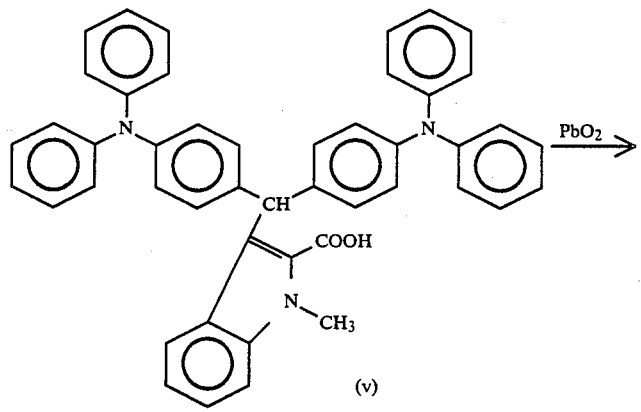

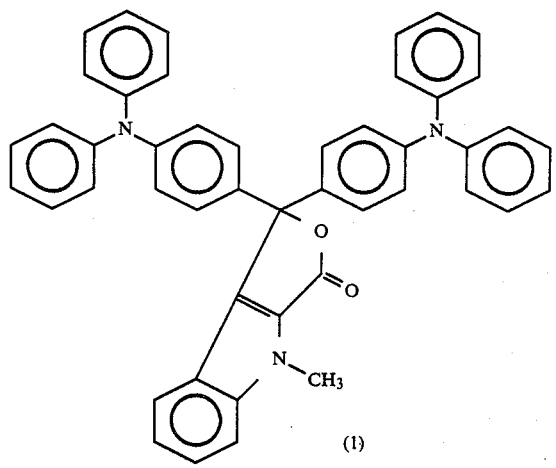

Synthesis of Compound (i)

To 270 ml of acetone were added 27 g of 4-N,N-diphenylaminobenzaldehyde and 30 g of potassium permanganate, and the mixture was refluxed for 2 hours. After the reaction mixture was filtered, hydrochloric acid was added to the filtrate to obtain a precipitate. The precipitate was collected by filtration. The yield was 22 g.

Synthesis of Compound (ii)

To 100 ml of benzene were added 22 g of the compound (i) obtained above and 6 ml of thionyl chloride, and the mixture was refluxed for 2 hours. The reaction mixture was concentrated under reduced pressure, and the crystalline precipitate was collected by filtration. The yield was 23 g, m.p. 200°–202° C.

Synthesis of Compound (iii)

To a mixture of 23 g of the compound (ii) obtained above, 24 g of triphenylamine and 100 ml of dichloromethane was added 15 g of alminum chloride, and the resulting mixture was stirred for 1 hour. The reaction mixture was poured into ice-cold water, and the aqueous mixture was extracted with ethyl acetate. The extract was then concentrated under reduced pressure, and the crystalline precipitate was recovered using acetonitrile. The yield was 29 g, m.p. 175°–177° C.

Synthesis of Compound (iv)

To a mixture of 29 g of the compound (iii) obtaind above and 180 ml of toluene was dropwise added 18 g of sodium dihydro-bis(2-methoxyethoxy)aluminate while keeping the temperature of not higher than 20° C. The reaction mixture was stirred at room temperature for 1 hour, and then the resulting mixture was extracted with ethyl acetate. The extract was concentrated under reduced pressure and the crystalline precipitate was recovered. The yield was 29 g, m.p. 130°–132° C.

Synthesis of Compounds (v) and (1)

A mixture of 3.5 g of the compound (iv) obtained above, 1.2 g of 1-methyl-2-carboxyindole and 10 ml of acetic acid was heated at 100° C. for 1 hour, and the mixture was extracted with ethyl acetate/water. To the extract was added 15 g of lead dioxide, and the mixture was stirred at room temperature for 30 minutes. The mixture was filtrated and then the filtrate was concentrated under reduced pressure. The residue was recrystallized from ethyl acetate/acetone to obtain the leuco dye (1). The yield was 2.5 g, m.p. 168°–169° C.

The other leuco dyes can be prepared by procedures similar to that of Synthesis Example 1.

In the recording material of the invention, the leuco dye having the formula (I) may be used singly or in combination. Other leuco dyes can be used in combination with the leuco dye of the invention to obtain various kinds of color images, whether the other leuco dye has the same hue as that of the leuco dye of the invention or not. Examples of other leuco dyes include a triarylmethane compound, a diphenylmethane compound, a xanthene compound, a thiazine compound, a spiro-compound and mixtures of these compounds.

The leuco dye contained in the recording material of the invention develops a color on contact with an acid color developer. In the case that the acid color developer is also contained in the recording material of the invention, the developer is arranged out of contact with the leuco dye. For instance, the leuco dye is contained in microcapsules and the acid color developer is arranged outside of the microcapsules in the recording material. Alternatively, the leuco dye and the developer can be contained in separate layers respectively. In the image forming process, the recording material is pressed or heated so that the leuco dye comes into contact with the acid color developer. In another embodiment, the acid color developer can be contained in a material different from the recording material of the invention containing the leuco dye. In the image forming process, the recording material is pressed or heated on the material containing the developer so that the leuco dye comes into contact with the developer. In these embodiment, the acid color developer can be contained in microcapsules which are different from those containing the leuco dye.

In the case that the recording material of the invention is used as a pressure-sensitive material or a light-sensitive material, the leuco dye is preferably contained in microcapsules. More preferably, the acid color developer is contained in another layer which is different from the layer of the microcapsules. The layer containing the developer can be provided on a material (a developer sheet or an image-receiving material) different from the recording material of the invention. In the case that the microcapsules are employed as mentioned above, the obtained color image can be improved in the sensitivity and sharpness.

In the image forming process, the leuco dye preferably comes into contact with the acid color developer at an elevated temperature. The color forming reaction can be greatly accelerated by heating the leuco dye and the developer. Heating temperature for the reaction usually ranges from 50° C. to 200° C., and preferably from 50° C. to 150° C. The heating time is usually from 1 second to 1 minute, and preferably from 1 second to 10 seconds.

Examples of the acid color developers include an acid clay developer (e.g., China clay), phenol-formaldehyde resins (e.g., p-phenylphenol-formaldehyde resin), metal salts of salicyclic acids (e.g., zinc 3,5-di-$\alpha$-methylbenzyl salicylate), phenol-salicylic acid-formaldehyde resin (e.g., p-octylphenol-zinc salicylate-formaldehyde resin), zinc rhodanide and zinc xanthate.

Among them, the metal salts of the salicylic acids are preferred, and zinc salicylates are most preferred. It has been found that the reaction of the color formation of the leuco compound proceeds rapidly and effectively in the presence of zinc salicylates. The metal salts of the salicylates are described in more detail in Japanese Patent Publication No. 52(1977)-1327. The oil-soluble color developers containing zinc salicylates are described in U.S. Pat. Nos. 3,864,146 and 4,046,941.

The acid color developer is preferably used in an amount of from 50 to 1,000 weight % based on the amount of the leuco dye, and more preferably from 100 to 1,000 weight %.

The leuco dye of the present invention can be used in any of pressure-sensitive, heat-sensitive and light-sensitive materials. However, the developed blue color of the leuco dye is especially suitable for a monochromatic recording material. Therefore, the recording material of the invention is preferably used as a pressure-sensitive material or a heat-sensitive material.

The pressure-sensitive material of the invention is described in more detail hereinbelow.

The pressure-sensitive material generally comprises a layer (or sheet) containing the leuco dye and a layer (or sheet) containing the acid color developer. The sheet comprises a layer containing the leuco dye or the acid color developer on a support.

The layer containing the leuco dye preferably contains a binder. The leuco dye is preferably contained in microcapsules which are dispersed in the layer.

The microcapsules containing the leuco dye can be prepared in the following manner.

The leuco dye is dissolved or dispersed in an appropriate organic solvent and the resulting solution or dispersion (oil liquid) is emulsified in an aqueous medium.

The organic solvent preferably has a boiling point of not lower than 180° C., because a low-boiling organic silvent suffers an evaporation loss during storage. Examples of the organic solvents include an phosphoric ester, a phthalic ester, a carboxylic acid ester, a fatty acid amide, an alkylated biphenyl, an alkylated terphenyl, a chlorinated paraffin and a diarylethanol.

Concrete examples of the organic solvents include tricresyl phosphate, trioctyl phosphate, octyl diphenyl phosphate, tricyclohexyl phosphate, dibutyl phthalate, dioctyl phthalate, dilauryl phthalate, dicyclohexyl phthalate, butyl oleate, diethylene glycol dibenzoate, dioctyl sebacate, dibutyl sebacate, dioctyl adipate, trioctyl trimellitate, acetyltriethyl citrate, octyl maleate, dibutyl maleate, isopropylbiphenyl, isoamylbiphenyl, chlorinated paraffin, diisopropylnaphthalene, 1,1'-ditolylethane, 2,4-di-tert-amylphenol and N,N-dibutyl-2-butoxy-5-tert-octylaniline. A vinyl compound can be also used as the organic solvent.

The leuco dye of the invention is preferably used in an amount of from 2 to 20 weight % based on the amount of the organic solvent.

The oil droplets in the emulsion is then processed for forming shell of the microcapsules.

There is no specific limitation on shell material of the microcapsule, and various known materials such as polymers can be employed as the shell material. Examples of the shell material include polyurethane, polyurea, polyamide, polyester, urea/formaldehyde resin, melamin resin, polystyrene, styrene/methacrylate copolymer, styrene/acrylate copolymer and mixtures thereof.

The microcapsule can be prepared by any of conventional methods without specific limitations. However an interfacial polymerization method and an internal polymerization method are preferred in the invention.

Where polyurea and/or polyurethane is used as the shell material of the microcapsule, a polyisocyanate is mixed with a second material capable of reacting with the polyisocyanate to form the shell (e.g., polyol or polyamine) in an aqueous medium or an oil liquid to be encapsulated and the mixture is emulsified and dispersed in water and then heated. Thus, a polymerization reaction takes place at the interface of oil droplets to form the shell of the microcapsule.

In the process for formation of the microcapsule, a water-soluble polymer can be used as a protective colloid. The water-soluble polymer is preferably anionic, nonionic or amphoteric.

The anionic polymer used as the protective colloid may be either a natural substance or a synthetic substance. The anionic polymer preferably has carboxyl group or sulfo group. Examples of the anionic polymers include natural substances such as gum arabic and alginic acid; semisynthetic substances such as carboxymethylcellulose, phthalated gelatin, sulfated starch, cellulose sulfate and lignin sulfonic acid; and synthetic substances such as a maleic anhydride copolymer and hydrolysis products thereof, a (meth)acrylic acid polymer and copolymers thereof, a vinylbenzene-sulfonic acid polymer and copolymers thereof and a carboxy-modified polyvinyl alcohol. Examples of the nonionic polymers include polyvinyl alcohol, hydroxyethylcellulose and methylcellulose. An example of the amphoteric polymer is gelatin.

These water-soluble polymers (protective colloids) are preferably used in the form of an aqueous solution. The polymer is preferably contained in the solution in an amount of 0.01 to 10 weight %.

Examples of the binder which can be used in the layer containing the leuco dye include polyvinyl alcohol, methylcellulose, carboxymethylcellulose, hydroxypropylcellulose, gum arabic, gelatin, polyvinyl pyrrolidone, casein, styrene/butadiene latex, acrylonitrile/-butadiene latex, polyvinyl acetate, polyacrylic ester and ethylene/vinyl acetate copolymer. These binders are preferably used in the form of an emulsion.

The binder is used in an amount of 0.5 to 5 g/m² on a solid basis.

The layer containing the leuco dye can be formed in such a manner that a microcapsule dispersion is mixed with a binder solution to prepare a coating solution and the coating solution is coated on a support according to a conventional coating method, such as bar coating, blade coating, air-knife coating, gravure coating, roll coating, spray coating and dip coating methods, and then dried.

The layer containing the leuco dye is usually provided in a range of 2.5 to 25 g/m² on a solid basis.

A paper support is preferably employed in the pressure sensitive material. A neutral paper having a pH of 6 to 9, which is measured according to a hot water extracting method, is preferably used as the paper support from the viewpoint of the storage stability of the recording material. The neutral paper support can be prepared, for instance, using a neutral size such as an alkylketene dimer. The surface of the paper support may be treated. The neutral paper support is described in more detail in Japanese Patent Provisional Publication No. 55(1980)-14281.

The layer (or sheet) containing the acid color developer can be formed in such a manner that an emulsion of the acid color developer is mixed with a binder to prepare a coating solution and the coating solution is coated on a support in a similar manner to that described above and then dried. The binder may be the same as that of the layer containing the leuco dye. The sheet containing the developer can be prepared using a different support from that of the pressure sensitive material.

The pressure-sensitive material containing a leuco dye is usually laminated on the sheet containing an acid color developer prior to use.

There are various embodiments other than that mentioned above. For instance, the leuco dye can be contained in different microcapsules from those containing the acid color developer and the two kinds of the microcapsules can be contained in the same layer (or sheet layer). In other embodiment, the leuco dye can be contained in a different layer from that containing the acid color coupler and both layers are provided on the same support. In this embodiment, the pressure-sensitive material has a multilayer structure.

In the recording process employing the pressure-sensitive material of the present invention, external pressure, for instance handwriting or typewriting pressure breaks the microcapsules and releases the leuco dye, which reacts with the acid color developer to produce visible color.

The heat-sensitive material (thermal recording material) of the invention is described in more detail hereinbelow.

The heat-sensitive material has basically the same structure as that of the aforementioned pressure-sensitive material. The heat-sensitive recording material comprises a heat-sensitive layer (thermal recording layer) provided on a support. The leuco dye of the invention contained in the heat-sensitive layer. The acid color developer is preferably contained in the same layer as that of the leuco dye in consideration of saving thermal energy required for thermal response and color formation. The leuco dye is preferably contained in microcapsules which are dispersed in the heat-sensitive layer.

The shell material of the microcapsule preferably is a polymer which is impermeable at room temperature and becomes permeable at an elevated temperature. The polymer more preferably has a glass transition temperature of from 60° to 200° C. The shell material most preferably is polyurea or polyurethane.

The thermal recording process employing the heat-sensitive material of the invention is carried out, for instance, in the following manner.

The heat-sensitive material is arranged such that it is in contact with a heating element (printing head) such as thermal needle or thermal head. The heating element is heated in series corresponding to electric signals having image information transmitted from facsimile or electronic computer, and it scans the heat-sensitive material in a direction at the same time while it is in contact with the material. When the heat-sensitive material is moved in a direction perpendicular to the scanning direction of the heating element, a two-dimensional printing or image can be formed on the heat-sensitive material.

While the typical recording materials of the invention have been described above, the recording material of the invention can be used as other recording materials such as a light-sensitive material, an electrothermal recording sheet, an ultrasonic recording sheet, an electron beam recording material and an electrostatic recording material.

Examples of the light-sensitive materials include a recording sheet comprising a photosensitive resin (e.g., photoresist material) and a light-sensitive material comprising a light-sensitive layer containing silver halide, a reducing agent and a polymerizable compound provided on a support, which is described in Japanese Patent Provisional Publication No. 61(1986)-69026 (corresponding to U.S. Pat. No. 4,629,676) as well as a conventional silver salt photo-sensitive material. In the light-sensitive material containing silver halide, a reducing agent and a polymerizable compound, the leuco dye and the polymerizable compound are preferably contained microcapsules which are dispersed in the light-sensitive layer, while the acid color developer is preferably contained in an image-receiving material. The light-sensitive material is pressed on the image-receiving material after image exposure and development.

The present invention is further described by the following examples without limiting the invention thereto. In the following examples, "part(s)" means "weight part(s)", unless otherwise indicated.

EXAMPLE 1

Preparation of Pressure-Sensitive Material

In 95 parts of hot water at about 80° C. was dissolved 5 parts of partial sodium salt of polyvinylbenzenesulfonic acid (VERSA, TL500, average molecular weight; 500,000; produced by National Starch Co.) while stirring over 30 minutes. The aqueous solution was then cooled. The resulting aqueous solution having a pH of from 2 to 3 was adjusted to pH of 4.0 using 20 weight % aqueous solution of sodium hydroxide.

In 100 parts of the obtained 5% aqueous solution of partial sodium salt of polyvinylbenzenesulfonic acid was emulsified 100 parts of 3.5 weight % diisopropylnaphthalene solution of the following leuco dye (1) to obtain an emulsion having oily droplets of average droplet size of 4.5 μm.

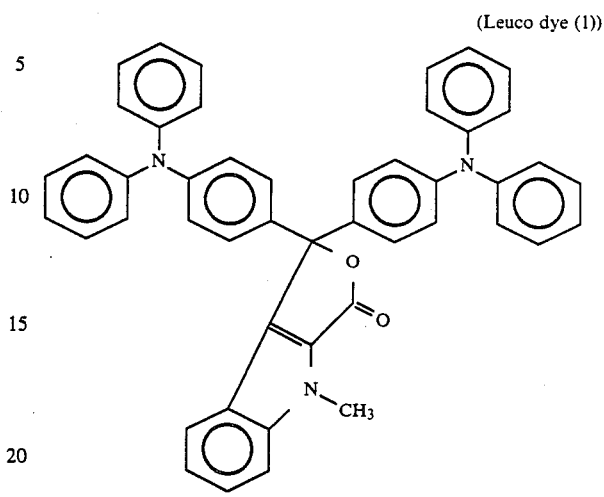
(Leuco dye (1))

Separately, 6 parts of melamine, 11 parts of 37 weight % aqueous solution of formaldehyde and 30 parts of water were heated to 60° C. while stirring. After 30 minutes, a clear aqueous solution of a mixture (precondensate) of melamine, formaldehyde and a melamine-formaldehyde precondensate was obtained. The aqueous solution had a pH of 6 to 8.

To the emulsion was added the precondensate solution obtained above. The resulting mixture was adjusted to pH of 6.0 using 3.6 weight % aqueous solution of phosphoric acid while stirring. The mixture was then heated to 65° C. while stirring for 6 hours to obtain a microcapsule dispersion. The dispersion was then cooled to room temperature and adjusted to pH of 9.0 using 20 weight % aqueous solution of sodium hydroxide.

To the microcapsule dispersion were added 200 parts of 10 weight % aqueous solution of polyvinyl alcohol (PVA-117, produced by Kuraray Co., Ltd.) and 50 parts of starch particles. To the mixture was further added water to obtain a coating solution having solid content of 20%. The coating solution was coated on the surface of a base paper having basis weight of 50 g/m² in coating amount of 5 g/m² based on the solid content using an air-knife coater and then dried to obtain a pressure-sensitive material (I).

EXAMPLE 2

A pressure-sensitive material (II) was prepared in the same manner as in Example 1, except the following leuco dye (4) was used in place of the leuco dye (1).

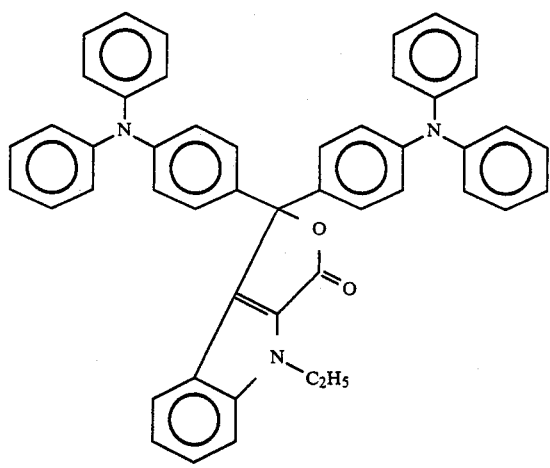

(Leuco dye (4))

COMPARISON EXAMPLE 1

A pressure-sensitive material (II) was prepared in the same manner as in Example 1, except that Crystal Violet Lactone (CVL) was used in place of the leuco dye (1).

Preparation of Sheet Containing Acid Color Developer

To 20 parts of 1-isopropylphenyl-2-phenylethane was added 10 parts of zinc 3,5-bis-α-methylbenzylsalicylate, and the mixture was heated at 90° C. to obtain a solution. The solution was added to 50 parts of 2 weight % aqueous solution of polyvinyl alcohol (PVA-117; produced by Kuraray Co., Ltd.) and 0.1 parts of 10% aqueous solution of triethanolamine dodecylbenzenesulfonate (surfactant) was further added to the mixture. The resulting mixture was stirred using a homogenizer to obtain an emulsion having average droplet size of 3 μm.

A dispersion containing 80 parts of calsium carbonate and 20 parts of zinc oxide was prepared using kedy mill, and to the emulsion was mixed the dispersion. To the mixture were further added 100 parts of 10 weight % aqueous solution of polyvinyl alcohol (PVA-117; produced by Kuraray Co., Ltd.) as binder and 10 parts of a carboxy-modified SBR latex (SN-307; produced by Sumitomo Naugatax Co.) as solid content. To the mixture was then added water to obtain a coating solution (A) having solid content of 20%.

Separately, a mixture containing 10 parts of zinc 3,5-bis-α-methyl-benzylsalicylate, 20 parts of silton clay, 60 parts of calcium carbonate, 20 parts of zinc oxide, 1 part of sodium hexametaphosphate and 200 parts of water was stirred using a sand grinder to obtain a dispersion having average particle size of 3 μm.

To the resulting dispersion was added 16 parts of a 10 weight % aqueous solution of polyvinyl alcohol (PVA-103; produced by Kuraray Co., Ltd.). To the mixture were added 100 parts of 10 weight % aqueous solution of polyvinyl alcohol (PVA-117; produced by Kuraray Co., Ltd.) and 10 parts of carboxy-modified SBR latex (SN-307; produced by Sumitomo Naugatax Co.) as solid content. To the mixture was then added water to obtain a coating solution (B) having solid content of 20%.

The coating solution (A) was mixed with the coating solution (B) in the ratio of 50 (A) to 50 (B) in terms of the amount of acid color developer. The mixture was coated on the surface of a base paper base having basis weight of 50 g/m² in coating amount of 5.0 g/m² based on the solid content using an air-knife coater and then dried to obtain a sheet containing acid color developer.

Evaluation of Pressure-Sensitive Material

Each of the pressure-sensitive materials (I) to (III) was pressed on the sheet containing an acid color developer and the density of each of the blue images obtained on the sheet was measured using a reflection densitometer.

Further, the light fastness of the obtained image was evaluated according to the following manner.

Each of the blue images was irradiated with light using xenon lamp at 80,000 lux for 3 hours. And then, the discoloration was evaluated measuring the density of the remaining color image and comparing the density with that before the irradiation.

The results are set forth in Table 1. In Table 1, "Remaining Ratio after Irradiation" means the ratio of the density of the color image after the irradiation to that before the irradiation.

TABLE 1

| Pressure-sensitive Material | Leuco Dye | Color Density | Remaining Ratio after Irradiation |
|---|---|---|---|
| (I) | (1) | 0.90 | 85% |
| (II) | (4) | 0.91 | 84% |
| (III) | (CVL) | 0.86 | 20% |

It is apparent from the results in Table 1 that each of the pressure-sensitive materials of the present invention (I) and (II) forms an improved color image which has a high maximum density and the light fastness of the image is also improved, compared with the pressure-sensitive material (III) containing a conventional leuco dye. Further, it is observed that the color developing rate is also improved in the pressure-sensitive materials (I) and (II).

We claim:

1. A recording material comprising a layer containing a leuco dye provided on a support, wherein the leuco dye has the formula (I):

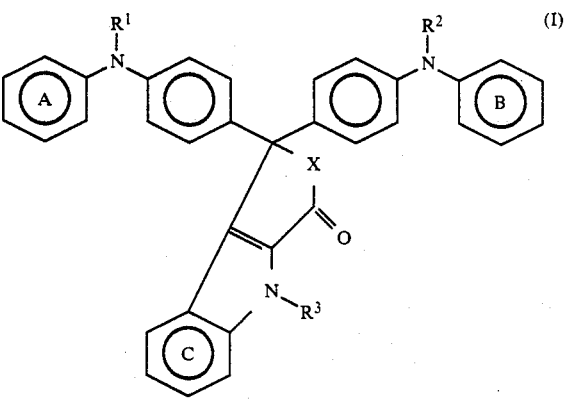

in which each of $R^1$ and $R^2$ independently is a monovalent group selected from the group consisting of an alkyl group, an aralkyl group and an aryl group; $R^3$ is an alkyl group or an aralkyl group; X is

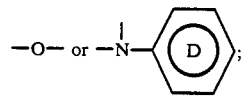

and each of $R^1$, $R^2$, $R^3$, X and the benzene rings A, B, C and D may have one or more substituent groups.

2. The recording material as claimed in claim 1, wherein each of $R^1$ and $R^2$ independently is an aryl group.

3. The recording material as claimed in claim 1, wherein the recording material is a pressure-sensitive recording material or a heat-sensitive recording material.

4. The recording material as claimed in claim 1, wherein the leuco dye is contained in microcapsules which are dispersed in the layer provided on the support.

5. The recording material as claimed in claim 1, wherein the layer containing the leuco dye further contains an organic solvent.

6. The recording material as claimed in claim 1, wherein the layer containing the leuco dye further contains an organic solvent, the amount of said leuco dye ranging from 2 to 20 weight % based on the amount of the organic solvent.

7. The recording material as claimed in claim 1, wherein the leuco dye is contained in microcapsules which are dispersed in the layer provided on the support, said microcapsules further containing an organic solvent.

8. The recording material as claimed in claim 1, wherein the leuco dye is contained in the microcapsules which are dispersed in the layer provided on the support, said microcapsules further containing a polymerizable compound.

* * * * *